United States Patent [19]
Lee et al.

[11] Patent Number: 6,013,550
[45] Date of Patent: Jan. 11, 2000

[54] METHOD TO DEFINE A CROWN SHAPED STORAGE NODE STRUCTURE, AND AN UNDERLYING CONDUCTIVE PLUG STRUCTURE, FOR A DYNAMIC RANDOM ACCESS MEMORY CELL

[75] Inventors: Yu-Hua Lee, Hsinchu; James Cheng-Ming Wu, Kao-Hsiung, both of Taiwan

[73] Assignee: Taiwan Semiconductor Manufacturing Company, Hsin-Chu, Taiwan

[21] Appl. No.: 09/169,436

[22] Filed: Oct. 9, 1998

[51] Int. Cl.[7] .............................................. H01L 21/8242
[52] U.S. Cl. ........................................ 438/253; 438/970
[58] Field of Search .................................. 438/253, 256, 438/396, 399, 634, 970, 976

[56] References Cited

U.S. PATENT DOCUMENTS

| | | | |
|---|---|---|---|
| 5,275,972 | 1/1994 | Ogawa et al. | 438/970 |
| 5,362,666 | 11/1994 | Dennison | 438/970 |
| 5,668,039 | 9/1997 | Lin | 438/387 |
| 5,677,223 | 10/1997 | Tseng | 437/52 |
| 5,753,547 | 5/1998 | Ying | 438/253 |
| 5,759,892 | 6/1998 | Wang et al. | 438/254 |
| 5,940,713 | 8/1999 | Green | 438/253 |

*Primary Examiner*—Chandra Chaudhari
*Attorney, Agent, or Firm*—George O. Saile; Stephen B. Ackerman

[57] ABSTRACT

A process for forming a crown shaped storage node structure, for a DRAM capacitor structure, has been developed. The process features the patterning of a top portion, of a storage node contact plug structure, after patterning of the crown shaped storage node structure, and after removal of a silicon oxide layer, used for the definition of the crown shaped storage node structure. The sequence of patterning steps allows mis-alignment between the crown shaped storage node structure, and the underlying storage node contact hole, to occur without vulnerability to insulator layers used to passivate the transfer gate transistors, of the DRAM cell. This process also features the use of a photoresist plug, used to protect a bottom shape, of the crown shaped storage node structure during the crown shaped storage node, and the storage node contact plug structure, patterning procedures.

26 Claims, 5 Drawing Sheets

METHOD TO DEFINE A CROWN SHAPED STORAGE NODE STRUCTURE, AND AN UNDERLYING CONDUCTIVE PLUG STRUCTURE, FOR A DYNAMIC RANDOM ACCESS MEMORY CELL

RELATED PATENT ACTIVITY

"A PROCESS TO FORM A CROWN CAPACITOR STRUCTURE FOR A DYNAMIC RANDOM ACCESS MEMORY CELL", Y. H. Lee, J. M. Wu, of Taiwan Semiconductor Manufacturing Corporation, invention disclosure TSMC98-103, (March 1998), Ser. No. 09/133,356 filed Aug. 13, 1998, assigned to a common assignee.

BACKGROUND OF THE INVENTION

(1) Field of the Invention

The present invention relates to fabrication processes used to create a dynamic random access memory, (DRAM), device, on a semiconductor substrate, and more specifically, relates to a process used to create a crown shaped storage node structure, for the DRAM device.

(2) Description of Prior Art

Cylindrical shaped, or crown shaped, capacitor structures, have been used to increase the surface area of DRAM capacitors, and thus increase the signal or performance of DRAM devices. Stacked capacitor structures, (STC), located overlying the transfer gate transistor, of the DRAM device, are limited by the dimensions of the underlying transfer gate transistor. Therefore to increase the surface area of the STC structure, without infringing on neighboring, underlying transfer gate transistors, specific STC shapes are employed. For example, a crown shaped storage node structure, comprised of vertical polysilicon features, connected to an underlying horizontal polysilicon feature, offers increased storage node surface area, when compared to counterparts, fabricated without vertical polysilicon features, or without the use of the crown shape. The use of sub-micron features, for high density DRAM cells, however can create concerns in terms of photolithographic alignments. For example if the crown shaped storage node structure is mis-aligned to an underlying conductive plug structure, where the conductive plug is used to allow communication between an overlying STC structure and an underlying conductive region in the semiconductor substrate, unwanted undercutting of passivating dielectric layers can result during the procedures used to fabricate the crown shaped storage node structure. These undercut regions of dielectric layer can result in yield and reliability difficulties, when completing the capacitor structure.

This invention will offer a process in which mis-alignment of a crown shaped storage node structure, to a storage node contact hole, can be tolerated without yield or reliability concerns. This invention features the final definition of a storage node contact plug structure, after definition of the crown shaped storage node structure, and after removal of an insulator shape, used for definition of the crown shaped storage node structure. Therefore unpatterned polysilicon, used for a top portion of a storage node contact plug structure, remains to protect underlying dielectric layers, during the removal of the insulator shape used for definition of the crown shaped storage node structure. Prior art, such as Wang et al, in U.S. Pat. No. 5,759,892, describe the use of spacers to allow for mis-alignments, however that prior art, when compared to the simpler, and different process, offered in this invention, adds complexity and cost.

SUMMARY OF THE INVENTION

It is an object of this invention to create a crown shaped storage node structure, for a DRAM, stacked capacitor structure.

It is another object of this invention to protect the bottom shape, of the crown shaped storage node structure, with a photoresist plug, during the definition of the crown shaped storage node structure.

It is still yet another object of this invention to invention to complete the definition of a top portion of a storage node contact plug structure, located in a storage node contact hole, after the definition of the crown shaped storage node structure, and after removal of the insulator shape, used for the definition of the crown shaped storage node structure.

In accordance with the present invention a process for forming a crown shaped storage node structure, for a DRAM capacitor, featuring a photoresist plug, used to protect the bottom shape of the crown shaped storage node structure, during definition of the crown shaped storage node structure, and featuring the definition of a top portion storage node contact plug structure, performed after definition of the crown shaped storage node structure, and after removal of the insulator shape, used for definition of the crown shaped storage node structure, is described. After the creation of a transfer gate transistor, a storage node contact hole is opened in a first insulator layer, exposing the top surface of source region, of the transfer gate transistor. A first layer of polysilicon is next deposited, completely filling the storage node contact hole, in addition to overlying the top surface of the first insulator layer. A second insulator layer is deposited and patterned, to form a storage node opening in the second insulator layer, exposing a portion of the top surface of the first polysilicon layer. A second layer of polysilicon is next deposited on the top surface of the second insulator layer, as well as on all the exposed surfaces of the storage node opening, including deposition on the surface of the first doped polysilicon layer, exposed at the bottom of the storage node opening. A photoresist plug is next formed on the regions of the second polysilicon layer, located in the storage node opening, while the regions of second polysilicon layer, on the top surface of the second insulator layer, are left unprotected. Removal of unprotected regions of second polysilicon layer, from the top surface of the second insulator layer, result in a crown shaped storage node structure, enveloping the photoresist plug, in the storage node opening. Removal of the second insulator layer, is followed by a dry etching procedure, applied to regions of first polysilicon layer, not covered by the crown shaped storage node structure, creating a storage node contact plug structure, underlying the crown shaped storage node structure, comprised of a top portion, overlying a bottom portion of the storage node contact plug, located in the storage node contact hole. Removal of the photoresist plug, capacitor dielectric formation, and creation of an upper polysilicon electrode, complete the procedure for formation of a DRAM capacitor structure, featuring the crown shaped storage node structure.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

Figure 1:
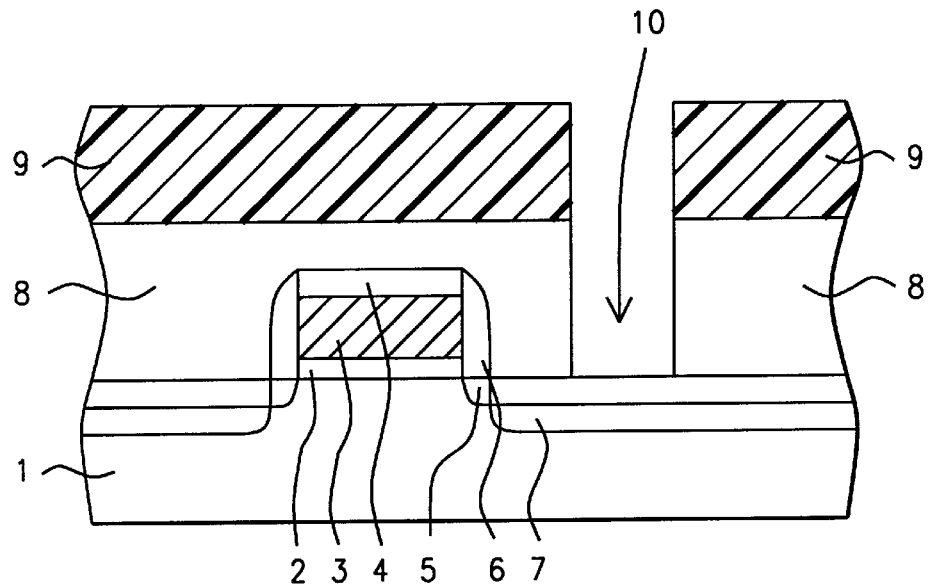
FIGS. 1, 2, 3a–3b, 4–9, which schematically, in cross-sectional style, show the creation the crown shaped capacitor structure, where the definition of the storage node contact plug structure, is performed after definition of the crown shaped storage node structure, and in which the crown shaped storage node structure does not completely overlay the storage node contact hole.

The process for forming a crown shaped storage node structure, for a DRAM capacitor structure, featuring the use of a photoresist plug, used to protect the bottom shape of the crown shaped storage node structure, during patterning procedures, and featuring the definition of the storage node contact plug structure, after the definition of the crown shaped storage node structure, and after removal of an insulator shape, used for definition of the crown shaped storage node structure, will now be described in detail. The creation of the DRAM, transfer gate transistor, is first addressed, and shown schematically in FIG. 1. A semiconductor substrate 1, comprised of P type, single crystalline silicon, having a <100>, crystallographic orientation, is used. A gate insulator 2, comprised of silicon dioxide, obtained via thermal oxidation procedures, to a thickness between about 50 to 200 Angstroms, is next grown. A polysilicon layer 3, is next deposited using low pressure chemical vapor deposition, (LPCVD), to a thickness between about 1500 to 4000 Angstroms. The polysilicon layer can be grown using in situ doping procedures, or grown intrinsically and doped via ion implantation procedures. If desired polysilicon layer 3, can be replaced by a polycide, (metal silicide on polysilicon), layer. This can be accomplished via an LPCVD procedure, used to deposit a thin polysilicon layer, followed by the deposition of an overlying metal silicide layer, such as tungsten silicide. Polycide layers offer lower resistance than polysilicon counterparts, thus resulting in performance enhancements. An insulator layer 4, comprised of silicon oxide, or silicon nitride, is next deposited via LPCVD, or plasma enhanced chemical vapor deposition, (PECVD), procedures, at a thickness between about 500 to 2000 Angstroms. Conventional photolithographic and anisotropic RIE procedures, using $CHF_3$ as an etchant for insulator layer 4, and using $Cl_2$ as an etchant for polysilicon layer 3, are used to create the polysilicon gate structure, shown schematically in FIG. 1. The photoresist shape, used as a mask for polysilicon gate structure patterning, is removed using plasma oxygen ashing and careful wet cleans.

Lightly doped, N type source/drain region 5, is next created via ion implantation of arsenic or phosphorous, at an energy between about 15 to 35 KeV, at a dose between about 1E14 to 1E15 atoms/$cm^2$. Insulator spacers 6, are formed by initially depositing a layer of silicon oxide, using LPCVD or PECVD procedures, to a thickness between about 1000 to 3000 Angstroms, followed by an anisotropic RIE procedure, using $CHF_3$ as an etchant. Insulator spacers 6, can also be comprised of silicon nitride. Heavily doped, N type source and drain region 7, shown schematically in FIG. 1, is next formed via ion implantation of either arsenic or phosphorous, at an energy between about 30 to 50 KeV, at a dose between about 1E15 to 1E16 atoms/$cm^2$.

A silicon oxide layer 8, shown schematically in FIG. 1, is next deposited, via low pressure chemical vapor deposition, (LPCVD), or plasma enhanced chemical vapor deposition, (PECVD), procedures, to a thickness between about 5000 to 12000 Angstroms, followed by a chemical mechanical polishing procedure, used for planarization purposes, resulting in a smooth top surface topography for silicon oxide layer 8. Photoresist shape 9, is then used as a mask, to allow an anisotropic, reactive ion etching, (RIE), procedure, using $CHF_3$, as an etchant for silicon oxide layer 8, to open storage node contact hole 10. Storage node contact hole 10, shown schematically in FIG. 1, exposing the top surface of a heavily doped, N type source/drain region 7, is between about 5000 to 12000 Angstroms in depth, with a diameter between about 2500 to 5000 Angstroms.

Figure 2:
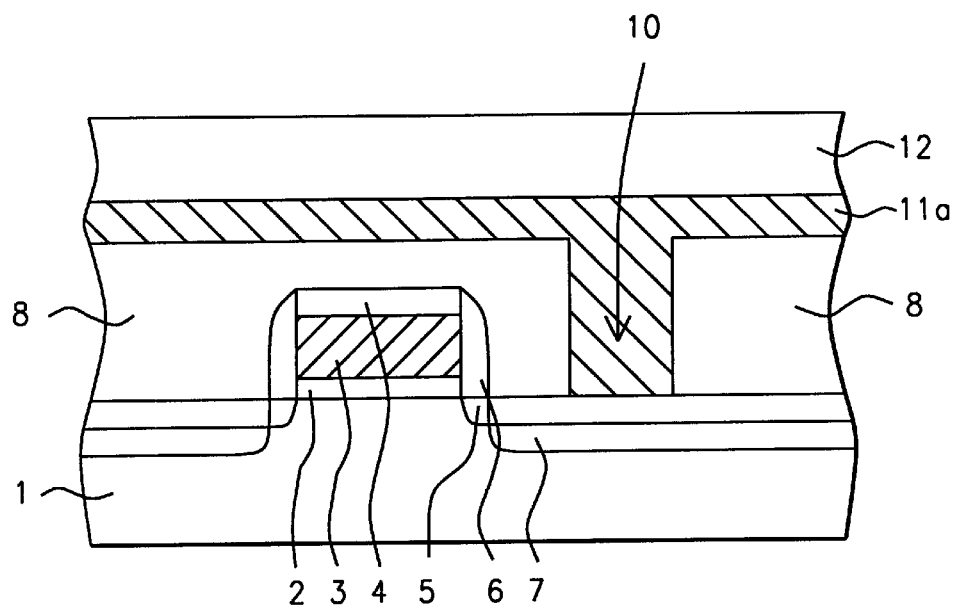

After removal of photoresist shape 9, via plasma oxygen ashing and careful wet cleans, polysilicon layer 11a, is deposited using LPCVD procedures, to a thickness between about 2000 to 5000 Angstroms, completely filling storage node contact hole 10, as well as overlying the top surface of silicon oxide layer 8. Polysilicon layer 11a, shown schematically in FIG. 2, can be deposited using in situ doping procedures, via the addition of either phosphine or arsine, to a silane source, or polysilicon layer 11a, can be deposited intrinsically, and doped via ion implantation procedures, using either arsenic or phosphorous. Removal of polysilicon layer 11a, from the top surface of silicon oxide 8, forming the desired storage node contact plug, will be delayed to later stage of this process. A thick insulator layer 12, comprised of silicon oxide is next deposited via LPCVD or PECVD procedures, on unpatterned polysilicon layer 11a, using tetraethylorthosilicate, (TEOS), as a source, to a thickness between about 5000 to 12000 Angstroms. This is schematically shown in FIG. 2.

Figure 3A:
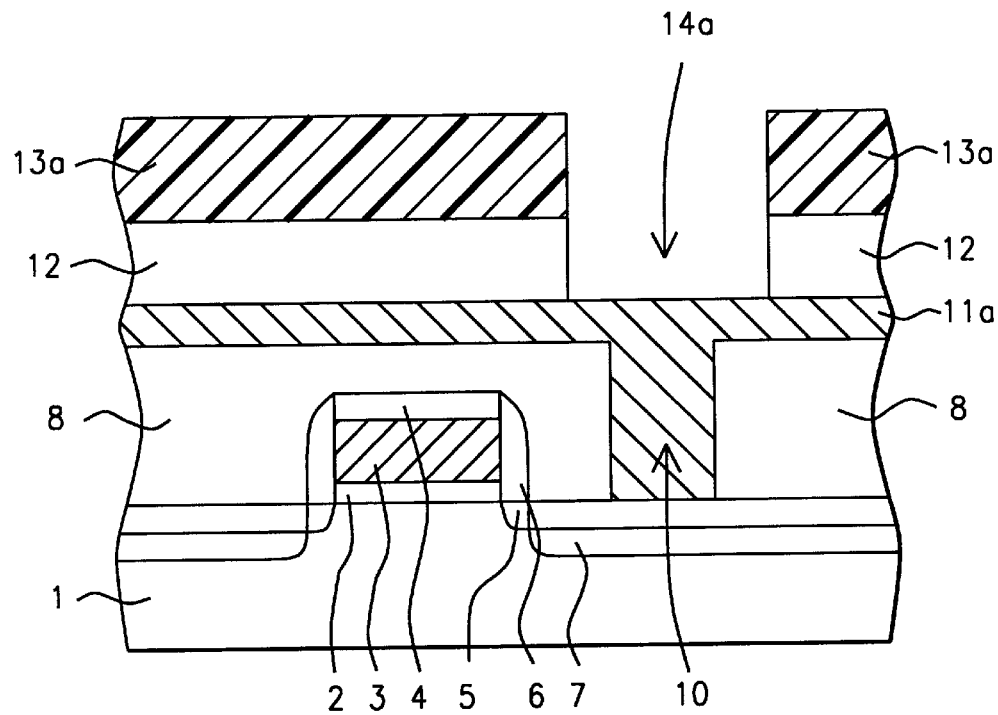
Figure 3B:
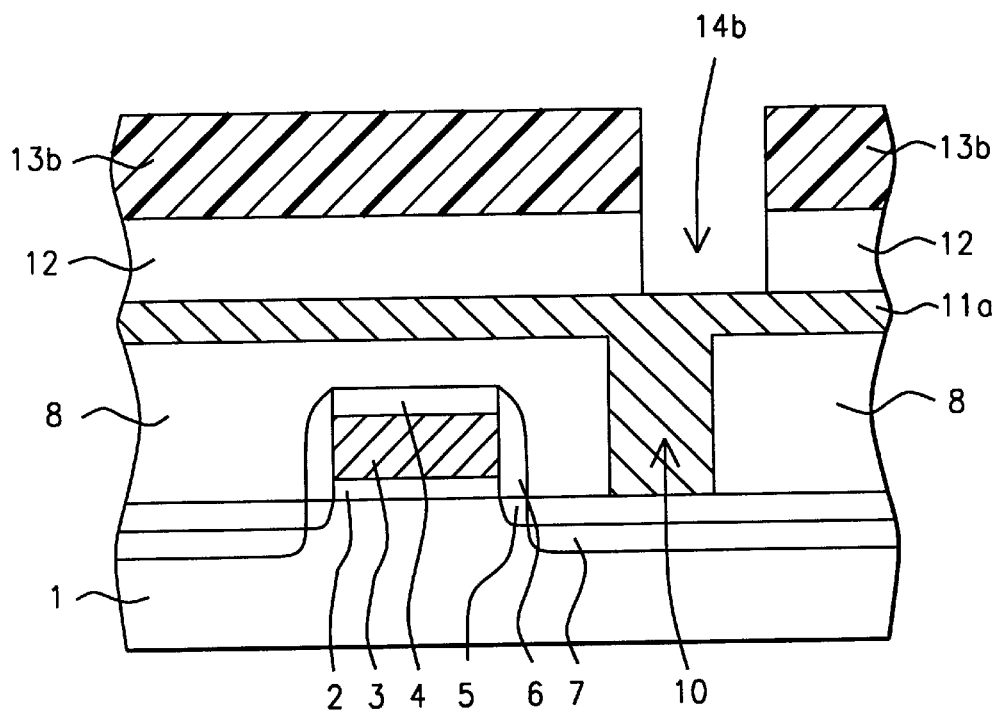

The formation of the storage node opening, in silicon oxide layer 12, is next addressed. FIG. 3A, schematically shows the creation of storage node opening 14a, completely overlying storage node contact hole 10, the preferred situation. However FIG. 3B, schematically shows storage node opening 14b, only partially overlying storage node contact hole 10, the undesired situation. However this invention, with the novel sequence of patterning the storage node contact plug structure, after the patterning of the crown shaped storage node structure, can tolerate the misalignment between the storage node opening and the underlying storage node contact hole, and thus the description of the remainder of this invention will feature the mis-aligned example, although this invention can also be applied to the preferred situation, featuring complete overlay of the storage node opening 14a, to underlying storage node contact hole 10, (FIG. 3A). Therefore for the mis-aligned version, (FIG. 3B), photoresist shape 13b, is used as a mask to allow an anisotropic RIE procedure, using $CHF_3$ as an etchant, to define storage node opening 14b, in silicon oxide layer 12, exposing a only a portion of the top surface of polysilicon layer 11a. The width of storage node opening 14b, is between about 3000 to 12000 Angstroms. This is schematically shown in FIG. 3B.

Figure 4:
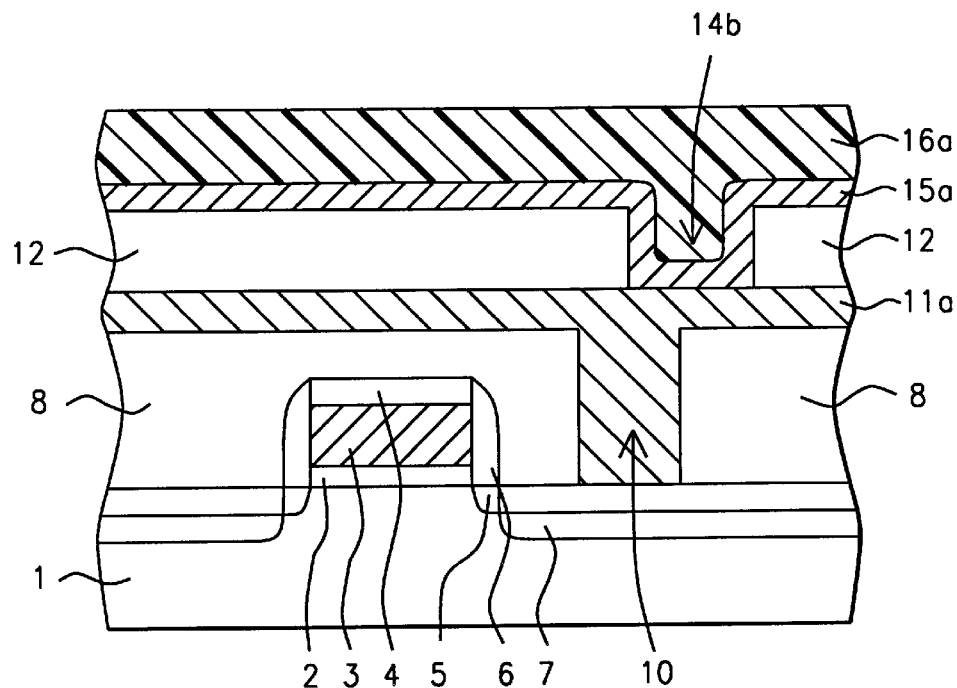

After removal of photoresist shape 13b, via plasma oxygen ashing and careful wet cleans, polysilicon layer 15a, is deposited, via LPCVD procedures, to a thickness between about 1000 to 3000 Angstroms. Polysilicon layer 15a, shown schematically in FIG. 4, can be doped in situ, during deposition, via the addition of arsine, or phosphine, to a silane ambient, or polysilicon layer 15a, can be deposited intrinsically, and doped via ion implantation procedures, using arsenic or phosphorous ions. Polysilicon layer 15a, shown schematically in FIG. 4, overlays the top surface of silicon oxide layer 12, in addition to coating the sides of storage node opening 14b. Polysilicon layer 15a, also overlies and contacts, a portion of the top surface of polysilicon layer 11a, in a region in which polysilicon layer 11a, partially overlies storage node contact hole 10. To remove unwanted regions of polysilicon layer 15a, from the top surface of silicon oxide layer 12, creating the desired crown shaped storage node structure, the portion of polysilicon layer 15a, overlying polysilicon layer 11a, has to be protected during the removal procedure. This is accomplished first by applying photoresist layer 16a, at a thickness between about 10000 to 20000 Angstroms, covering the region of polysilicon layer 15a, which resides on the top surface of silicon oxide layer 12, as well as covering the region of polysilicon layer 15a, in storage node opening 14b completely filling opening 14b. This is schematically shown in FIG. 4.

Figure 5:
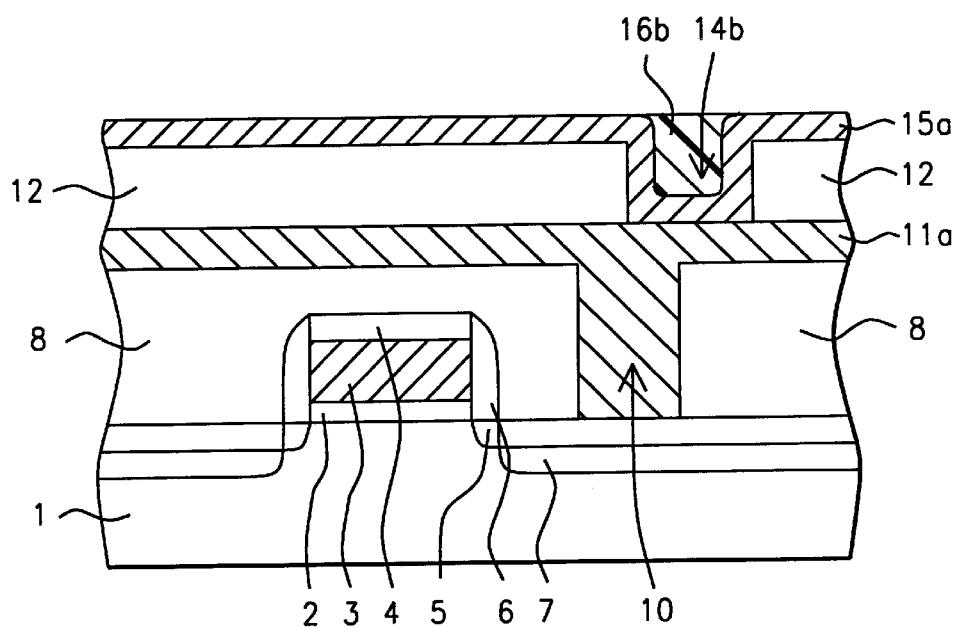

Photoresist layer 16a, is next subjected to a blanket exposure, at a dose between about 0 to 40 millijoules, followed by development of the exposed photoresist layer 16a, using a standard developer, for a time between about 2 to 4 mins. This development procedure, results in removal of the exposed portion of photoresist layer 16a, leaving photoresist plug 16b, between about 3000 to 13000 Angstroms in thickness, remaining in storage node opening 14b. This is schematically shown in FIG. 5. If desired, another iteration is to form photoresist plug 16b, without the exposure procedure, using a longer development cycle, between about 4 to 6 mins., applied to unexposed photoresist layer, for removal of the top portion of photoresist layer 16a. Photoresist plug 16b, overlays the portion of polysilicon layer 15a, that will be used to form the crown shaped storage node structure.

Figure 6:
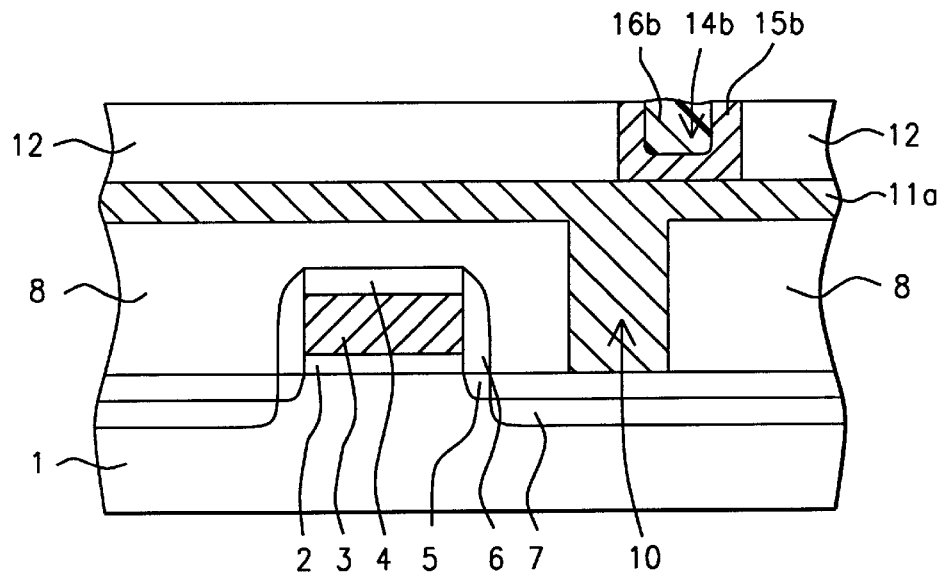
Figure 7:
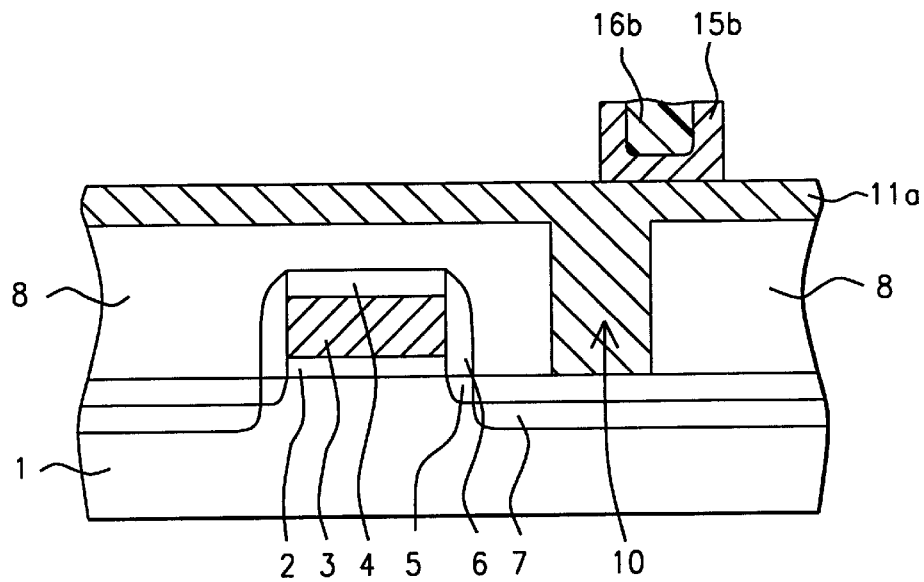

Removal of exposed regions of polysilicon layer 15a, is next performed using an etch back procedure, comprised of an anisotropic RIE procedure, using $Cl_2$ as an etchant. Another alternative is to remove the exposed portions of polysilicon layer 15a, via a chemical mechanical polishing, (CMP), procedure. Both procedures result in the creation of crown shaped storage node structure 15b, protected from the removal procedures, by photoresist plug 16b. This is schematically shown in FIG. 6. Removal of silicon oxide layer 12, via use of a buffered hydrofluoric acid solution is next accomplished, and shown schematically in FIG. 7, with polysilicon layer 11a, providing the etch stop needed during the removal of silicon oxide layer 12, and with photoresist plug 16b, still residing in storage node opening 14b. The presence of polysilicon layer 11a, is imperative in protecting silicon oxide layer 8, which can be exposed to the wet etch procedure, for the case in which mis-alignment between storage node opening 14b and underlying storage node contact hole 10, occurred.

Figure 8:
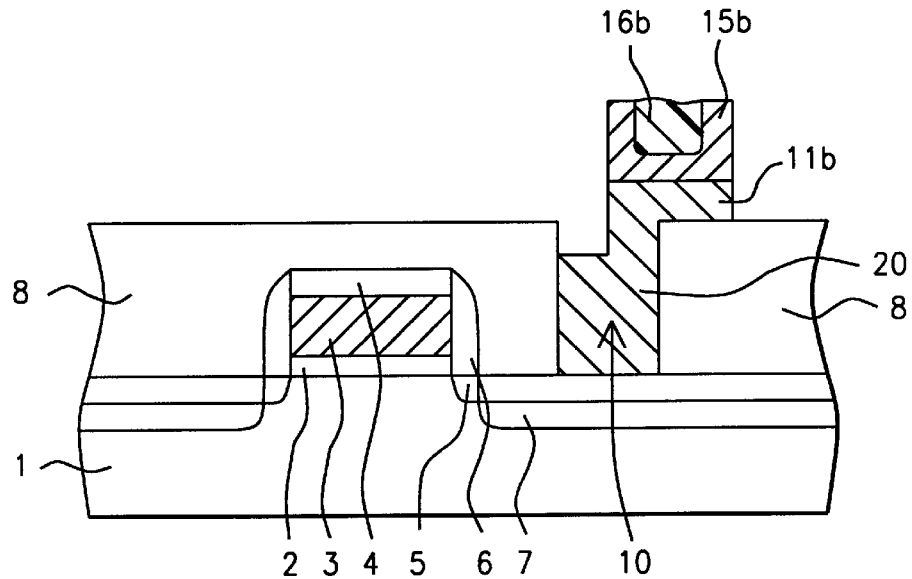

The definition of storage node contact plug structure 11b, can now be addressed, again delaying this procedure to allow unpatterned polysilicon layer 11a, to protect silicon oxide layer 8, during the previous non-selective, wet etch removal of overlying silicon oxide layer 12. An anisotropic RIE procedure, using $Cl_2$ as an etchant, and using photoresist plug 16b, to protect the bottom shape of crown shaped storage node structure 15b, is used to define storage node contact plug structure 11b, shown schematically in FIG. 8. Storage node contact plug structure, is comprised of a top portion 1ib, directly underlying crown shaped storage node structure 15b, and a bottom portion 20, located in storage node contact hole 10. An overetch cycle, used to insure complete removal of polysilicon layer 11a, from regions not protected by crown shaped storage node structure 15b, and by photoresist plug 16b, results in slight, and non-deleterious notching of bottom portion 20, of the storage node contact plug, in an unprotected region. Photoresist plug 16b, is removed at this stage of the process via plasma oxygen ashing, and careful wet cleans, or via use of standard developer solutions, such as KOH solutions.

Figure 9:
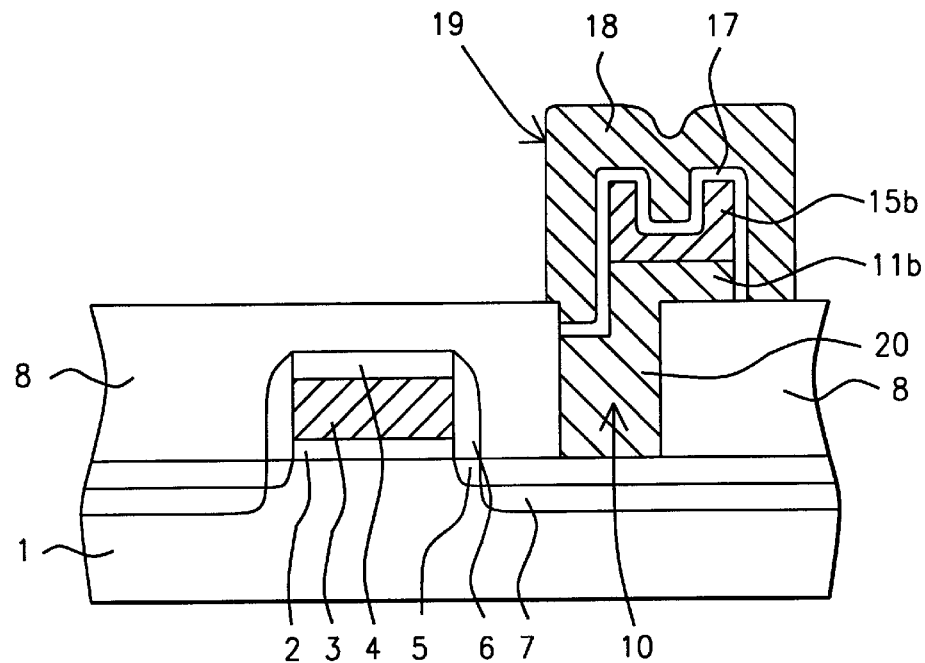

FIG. 9, shows the completion of the DRAM capacitor structure, featuring a crown shaped storage node structure. First a capacitor dielectric layer 17, is formed on the exposed surfaces of crown shaped storage node structure 15b, as well as on the exposed surfaces of storage node contact plug structure 11b. Capacitor dielectric layer 17, is a composite dielectric layer of silicon oxynitride—silicon nitride—silicon oxide, (ONO), at an equivalent silicon oxide thickness of between about 40 to 80 Angstroms. The ONO layer is created by initially creating a native, silicon oxide layer, between about 10 to 30 Angstroms in thickness, on the surfaces of crown shaped storage node structure 15b, as well as on the exposed surfaces of storage node contact plug structure 11b. A thin layer of silicon nitride is next deposited, using LPCVD procedures, to a thickness between about 30 to 50 Angstroms. An oxidation procedure, performed in an oxygen—steam ambient, is next used to convert the surface of the silicon nitride layer, to a silicon oxynitride layer, thus creating the ONO layer, overlying crown shaped storage node structure 15b, and storage node contact plug structure 1ib. After creation of capacitor dielectric layer 17, another polysilicon layer, is deposited, via LPCVD procedures, to a thickness between about 500 to 2000 Angstroms. The polysilicon layer can be in situ doped, during deposition, via the addition of arsine, or phosphine, to a silane ambient, or the polysilicon layer, can be grown intrinsically and doped via ion implantation procedures, using arsenic or phosphorous. Patterning of the polysilicon layer is next performed, via conventional photolithographic and anisotropic RIE procedures, using $Cl_2$ as an etchant, creating polysilicon upper electrode 18, shown schematically shown in FIG. 9, and completing the formation of DRAM capacitor structure 19, comprised of polysilicon upper electrode 18, on capacitor dielectric layer 17, and underlying crown shaped storage node structure 15b.

While this invention has been particularly shown and described with reference to the preferred embodiments thereof, it will be understood by those skilled in the art that various changes in form and details may be made without departing from the spirit and scope of the invention.

What is claimed is:

1. A method of creating a storage node structure, for a dynamic random access memory (DRAM), capacitor structure, on a semiconductor substrate, comprising the steps of:

provinding a transfer gate transistor, on said semiconductor substrate, comprised of a polysilicon gate structure, on a gate insulator layer, with a source/drain region, in a region of said semiconductor substrate, not covered by said polysilicon gate structure;

forming a storage node contact hole, in a first insulator layer, exposing a source region, of said source/drain region;

depositing a first polysilicon layer on the top surface of said first insulator layer, and completely filling said storage node contact hole;

forming a storage node opening in a second insulator layer, exposing a portion of the top surface of said first polysilicon layer, in a region in which said first polysilicon overlays a portion of said storage node contact hole;

depositing a second polysilicon layer on the top surface of said second insulator layer, on the surfaces of said second insulator, exposed in said storage node opening, and on the portion of said first polysilicon layer, exposed at the bottom of said storage node opening;

forming a photoresist plug, in said storage node opening, covering the portion of said second polysilicon layer located on the sides of, and at the bottom of, said storage node opening;

removing the portion of said second polysilicon layer, located on the top surface of said second insulator layer, not covered by said photoresist plug, to form a crown shaped storage node structure, underlying said photoresist plug, in said storage node opening;

removing said second insulator layer;

removing the regions of said first polysilicon layer, not protected by said crown shaped storage node structure, and not protected by said photoresist plug, to create a storage node contact plug structure, comprised of a top portion of said storage node contact plug structure, located underlying said crown shaped storage node structure, and a bottom portion of said storage node contact plug structure, located in said storage node contact hole;

removing said photoresist plug;

forming a capacitor dielectric layer on the exposed surfaces of said crown shaped storage node structure, and on the exposed surfaces of said storage node contact plug structure; and forming an upper polysilicon electrode, on said capacitor dielectric layer.

2. The method of claim 1, wherein said first insulator layer is a silicon oxide layer, obtained via LPCVD or PECVD procedures, to a thickness between about 5000 to 12000 Angstroms.

3. The method of claim 1, wherein said storage node contact hole is formed in said first insulator layer, to a depth between about 5000 to 12000 Angstroms, and with a diameter between about 2500 to 5000 Angstroms, via an anisotropic RIE procedure, using $CHF_3$ as an etchant.

4. The method of claim 1, wherein said first polysilicon layer is obtained via LPCVD procedures, at a thickness between about 2000 to 5000 Angstroms, and either doped in situ, during deposition, via the addition of either arsine or phosphine, to a silane ambient, or the polysilicon layer is deposited intrinsically, and doped via ion implantation of arsenic or phosphorous ions.

5. The method of claim 1, wherein said second insulator layer is a silicon oxide layer, obtained via LPCVD or PECVD procedures, to a thickness between about 5000 to 12000 Angstroms, using TEOS as a source.

6. The method of claim 1, wherein said storage node opening, in said second insulator layer, is formed via an anisotropic RIE procedure, using $CHF_3$ as an etchant.

7. The method of claim 1, wherein said second polysilicon layer is deposited via LPCVD procedures, to a thickness between about 1000 to 3000 Angstroms, and doped in situ, during deposition, via the addition of arsine or phosphine, to a silane ambient, or grown intrinsically, and doped via an ion implantation procedure, using arsenic or phosphorous ions.

8. The method of claim 1, wherein said photoresist plug is between about 3000 to 13000 Angstroms, in thickness, formed from a photoresist layer, applied at a thickness between about 10000 to 20000 Angstroms, blanket exposed at a dose between about 0 to 40 millijoules, and developed in a standard developer solution, for a time between about 2 to 4 mins.

9. The method of claim 1, wherein said crown shaped storage node structure, is formed via removal of said second polysilicon layer, from the top surface of said second insulator layer, via an anisotropic RIE procedure, using $Cl_2$ as an etchant, or via a chemical mechanical polishing procedure.

10. The method of claim 1, wherein said second insulator layer is removed using a buffered hydrofluoric acid solution.

11. The method of claim 1, wherein said top portion of said storage node contact plug structure is formed via an anisotropic RIE procedure, applied to regions of said first polysilicon layer, not protected by said crown shaped storage node structure, or by said photoresist plug, using $Cl_2$ as an etchant.

12. The method of claim 1, wherein said photoresist plug is removed via a plasma oxygen ashing procedure, or via a wet removal procedure, using a standard developer solution.

13. The method of claim 1, wherein said capacitor dielectric layer is a silicon oxynitride—silicon nitride—silicon oxide layer, (ONO), at an equivalent silicon dioxide thickness between about 40 to 80 Angstroms, created by an initial thermal oxidation to form a silicon oxide layer, between about 10 to 30 Angstroms, followed by a deposition of silicon nitride, to a thickness between about 30 to 50 Angstroms, and thermal oxidation of said silicon nitride layer, creating a silicon oxynitride layer, on the underlying, said silicon oxide layer.

14. A method for fabricating a crown shaped storage node structure, for a DRAM device, on a semiconductor substrate, wherein the top shape of a storage node contact plug structure, is formed after the creation of said crown shaped storage node structure, and after the removal of a silicon oxide layer, used to define a storage node opening, and wherein a photoresist plug is used to protect a bottom shape of said crown shaped storage node structure, during a patterning procedure used to create said crown shaped structure, and during the procedure used to create said top shape of said storage node contact plug structure, comprising the steps of:

providing a transfer gate transistor, comprised of a polysilicon gate structure, on a gate insulator layer, with a source/drain region, in a region of said semiconductor substrate, not covered by said polysilicon gate structure;

depositing a first silicon oxide layer;

forming a storage node contact hole, in said first silicon oxide layer, exposing a source region, of said source/drain region, located at the bottom of said storage node contact hole;

depositing a first polysilicon layer, on the top surface of said first silicon oxide layer, and completely filling said storage node contact hole;

depositing a second silicon oxide layer;

forming a storage node opening in said second silicon oxide layer, exposing the top surface of a portion of said first polysilicon layer, in a region in which said first polysilicon layer overlays a portion of said storage node contact hole;

depositing a second polysilicon layer on the top surface of said second silicon oxide layer, on the surfaces of said second silicon oxide layer, exposed in said storage node opening, and on the portion of said first polysilicon layer, exposed at the bottom of said storage node opening;

applying a photoresist layer on said second polysilicon layer, completely filling said storage node opening;

forming said photoresist plug, on the region of said second polysilicon layer located in said storage node opening, by removing the regions of said photoresist layer located on the top surface of said second polysilicon layer, where said second polysilicon layer overlays the top surface of said second silicon oxide layer;

removing regions of said second polysilicon layer, from the top surface of said second silicon oxide layer, not protected by said photoresist plug, to form said crown shaped storage node structure, underlying said photoresist plug, in said storage node opening, with said crown shaped storage node structure overlying said first polysilicon layer;

performing a wet etch procedure to remove said second silicon oxide layer from the top surface of said first polysilicon layer;

patterning of said first polysilicon layer, using said crown shaped storage node structure, and said photoresist plug, as a mask, to create said top portion of said storage node contact plug structure, located overlying a bottom portion of said storage node contact plug structure, and underlying said crown shaped storage node structure, with said bottom portion of said storage node contact plug structure located in said storage node contact hole;

removing said photoresist plug;

forming a capacitor dielectric layer, on the exposed surfaces of said crown shaped storage node structure, and on the exposed surfaces of said top portion of said storage node contact plug structure; and forming an polysilicon upper electrode, on said capacitor dielectric layer.

15. The method of claim 14, wherein said first silicon oxide layer is obtained via LPCVD or PECVD procedures, at a thickness between about 5000 to 12000 Angstroms.

16. The method of claim 14, wherein said storage node contact hole is formed in said first silicon oxide layer, at a depth between about 5000 to 12000 Angstroms, and with a diameter between about 2500 to 5000 Angstroms, via an anisotropic RIE procedure, using $CHF_3$ as an etchant.

17. The method of claim 14, wherein said first polysilicon layer is obtained via LPCVD procedures, at a thickness between about 2000 to 5000 Angstroms, and doped in situ, during deposition, via the addition of arsine or phosphine, to a silane ambient, or deposited intrinsically, and doped via ion implantation of arsenic or phosphorous ions.

18. The method of claim 14, wherein said second silicon oxide layer is deposited using LPCVD or PECVD procedures, to a thickness between about 5000 to 12000 Angstroms, using TEOS as a source.

19. The method of claim 14, wherein said storage node opening, in said second silicon oxide layer, is created via an anisotropic RIE procedure, using $CHF_3$ as an etchant.

20. The method of claim 14, wherein said second polysilicon layer is deposited using LPCVD procedures, to a thickness between about 1000 to 3000 Angstroms, and doped either during deposition, via an in situ doping procedure, via the addition of arsine, or phosphine, to a silane ambient, or deposited intrinsically and doped via ion implantation of arsenic or phosphorous ions.

21. The method of claim 14, wherein said photoresist layer is applied at a thickness between about 10000 to 20000 Angstroms.

22. The method of claim 14, wherein said photoresist plug is formed at a thickness between about 3000 to 13000 Angstroms, via exposure of said photoresist layer, at a dose between about 0 to 40 millijoules, followed by the removal of the exposed region of said photoresist layer, in a standard developer solution, for a time between about 2 to 4 mins.

23. The method of claim 14, wherein said crown shaped storage node structure is formed via an anisotropic RIE procedure, applied to regions of said second polysilicon layer, not protected by said photoresist plug, using $Cl_2$ as a etchant.

24. The method of claim 14, wherein said wet etch, used to remove said second silicon oxide layer, is comprised of a buffered hydrofluoric acid solution.

25. The method of claim 14, wherein said top portion of said storage node contact plug structure, is formed via an anisotropic RIE procedure, using $Cl_2$ as an etchant, applied to regions of said first polysilicon layer, not protected by said crown shaped storage node structure, or by said photoresist plug.

26. The method of claim 14, wherein said photoresist plug is removed via a plasma oxygen ashing procedure, or via use of a wet procedure, using a standard developer solution.

* * * * *